(12) United States Patent
Duvvury

(10) Patent No.: US 6,208,493 B1
(45) Date of Patent: *Mar. 27, 2001

(54) METHOD AND SYSTEM FOR PROTECTING INTEGRATED CIRCUITS AGAINST A VARIETY OF TRANSIENTS

(75) Inventor: Charvaka Duvvury, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 08/120,998

(22) Filed: Sep. 13, 1993

(51) Int. Cl.$^7$ ...................................................... H02H 3/22
(52) U.S. Cl. ............................................ 361/56; 361/111
(58) Field of Search .............................. 361/220, 56, 111, 361/58

(56) References Cited

U.S. PATENT DOCUMENTS

| 3,876,926 | * | 4/1975 | Schott et al. | 322/28 |
| 4,617,605 | * | 10/1986 | Obrecht et al. | 361/220 |
| 4,920,405 | | 4/1990 | Itoh et al. | 357/74 |
| 5,008,736 | * | 4/1991 | Davies et al. | 357/75 |
| 5,021,853 | * | 6/1991 | Mistry | 357/23.13 |
| 5,268,588 | * | 12/1993 | Marum | 361/56 |

FOREIGN PATENT DOCUMENTS

| 314 465 A3 | 3/1989 | (EP) | H01L/27/02 |
| 62-039045 | 2/1987 | (JP) | H01L/27/06 |
| 62-165967 | 7/1987 | (JP) | H01L/27/06 |

* cited by examiner

Primary Examiner—Michael J. Sherry
(74) Attorney, Agent, or Firm—Jacqueline J. Garner; W. James Brady; Frederick J. Telecky, Jr.

(57) ABSTRACT

A high-energy pulse protection device (10) protects an integrated circuit (28 and 30). The integrated circuit (28 and 30) is associated with an integrated circuit substrate region (64). The high-energy pulse protection device (10), has a protection circuit substrate region (74) that is disassociated from the integrated circuit substrate region (64). A primary protection circuit (40 and 42) is associated with the protection circuit substrate region (74) and has at least one connection (22) with the integrated circuit (28 and 30) for receiving and dissipating, through the at least one connection (22), a high-energy pulse. This protects the integrated circuit (28 and 30) from the high-energy pulse.

21 Claims, 2 Drawing Sheets

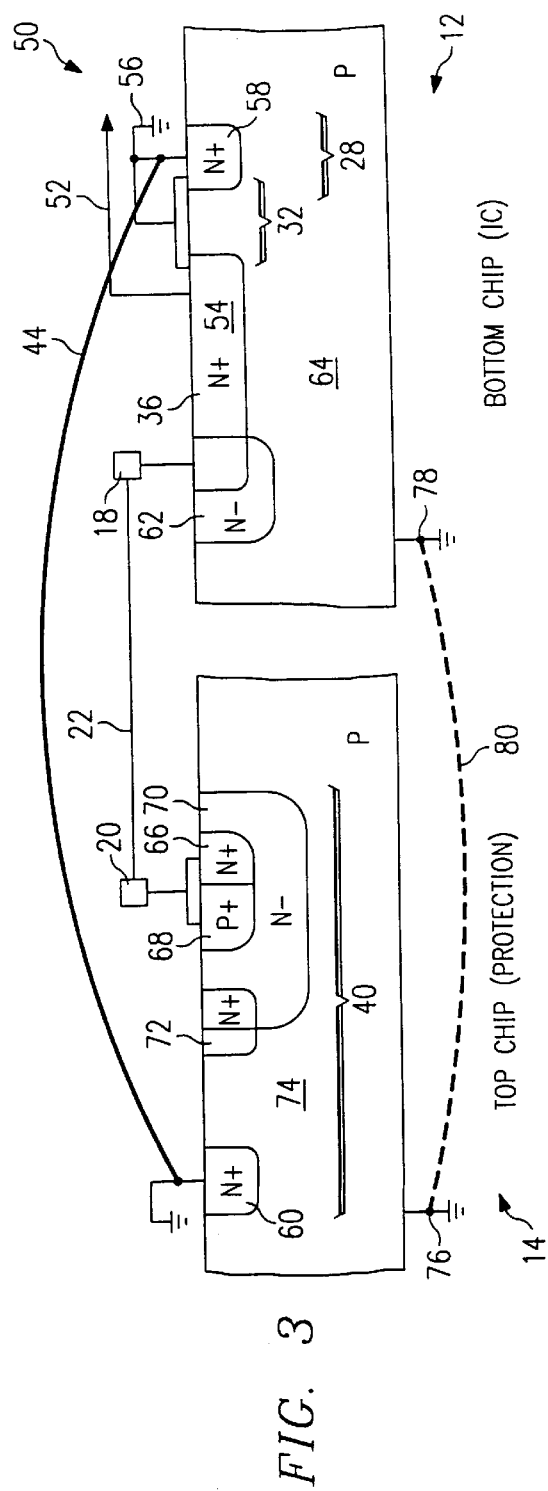
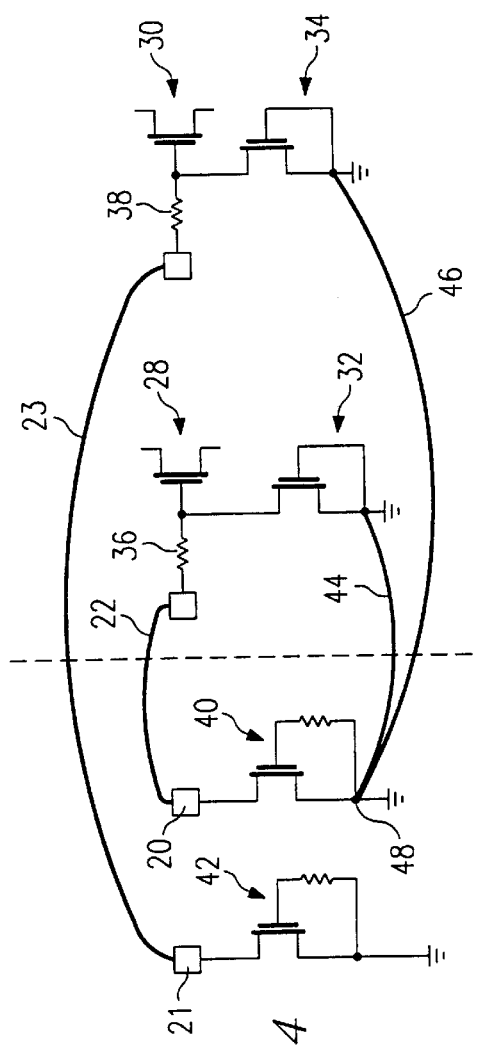
FIG. 3
FIG. 4

METHOD AND SYSTEM FOR PROTECTING INTEGRATED CIRCUITS AGAINST A VARIETY OF TRANSIENTS

TECHNICAL FIELD OF THE INVENTION

The present invention generally relates to integrated circuits and, more particularly, to a method and system for protecting integrated circuits against a variety of electrical transients.

BACKGROUND OF THE INVENTION

Integrated circuits are used in a variety of environments including harsh ones that can seriously deter the integrated circuit's proper operation. In general, the phenomena known as electrostatic discharge (ESD) and electrical overstress (EOS) can affect and, in some cases, prohibit the functioning of integrated circuits. ESD may be thought of as high-energy pulse that occurs whenever someone or something carrying an electrical charge touches the integrated circuit. In EOS, a voltage spike of a longer duration exists. An example of EOS occurs when a system is improperly tested or during improper operation of an electrical system that causes a large voltage spike to enter the integrated circuit. In some even harsher environments, such as that of an automobile, a phenomenon known as "load dump" may occur. An example of the load dump electrical transient happens when a battery cable disconnects from the battery terminal as a result of the car hitting a bump or experiencing some other jolt. The disconnected battery cable, if connected to the alternator, may contact a component such as an engine control circuit that has an embedded integrated circuit. This battery cable contact dumps the energy from the alternator into the integrated circuit and can destroy its proper operation.

Integrated circuits that protect against ESD often use on-chip protection at the input and output pins. Protection devices that protect against ESD may protect against high-energy pulses of up to 15 killivolts. On-chip protection device designs for pulses having magnitudes beyond this level are not possible due to practical limits of size on the integrated circuit chip. Circuits that address the EOS and load dump situations may use a metal oxide veristor (MOV) device to absorb the high-energy pulse. MOV devices, however, are bulky and expensive to implement for all integrated circuits that may require protection. The heat that the known protection devices produces also impairs performance of integrate circuits as the temperature rises in the associated silicon substrate region.

SUMMARY OF THE INVENTION

A need, therefore, exists for a method and system that protect integrated circuits against electrical transients such as the ESD, EOS, and load dump transients.

A further need exists for a method and system that protect integrated circuits against electrical transients that consume little of the valuable integrated circuit board space and that cost less than known approaches to implement for various types of electrical transients.

Yet a further need appears for a method and system that in one embodiment protects integrated circuits against not just one type, but a variety of electrical transients, including ESD, EOS, and load dump situations. That is, the needed method and system should have sufficient flexibility to cover a large range of voltage values that may occur during these transients.

The present invention, accordingly, provides a method and system for protecting integrated circuits against electrical transients and overcomes or reduces disadvantages and limitations associated with prior integrated circuit electrical transient protection systems and methods.

One aspect of the invention is a pulse protection device for protecting an integrated circuit from electrical transients. The protected integrated circuit has an integrated circuit substrate region. The pulse protection device includes a protection circuit substrate region that is separate from the integrated circuit substrate region. The integrated circuit substrate region, while different from the protected circuit substrate region may, or may not, be on the same chip. On the protection circuit substrate region is a primary protection circuit that has at least one connection with the integrated circuit for receiving and dissipating the high-energy pulse. Since the protection circuit receives the high-energy pulse protection, instead of the integrated circuit, the integrated circuit is protected against a variety of electrical transients. In the present embodiment, a triggering circuit associates with the integrated circuit and triggers upon the high-energy pulse entering the integrated circuit substrate region. This causes the high-energy pulse to flow to the protection circuit. The protection circuit then shunts the high-energy pulse to ground.

A technical advantage of the present invention is that it provides a compact, effective, and inexpensive solution to protecting integrated circuits against electrical transients. The system of the present invention provides on a separate protection circuit substrate region that may occupy a separate chip or a separate region of the same chip as the chip that the integrated circuit uses. Because the present invention uses a separate chip or separate substrate region, clamping devices like those of known protection schemes need not consume valuable substrate space of the integrated circuit chip or substrate region.

Another technical advantage of the present invention is that it has sufficient flexibility for use in protecting the integrated circuit against a wide variety of electrical transients, including ESD, EOS, and, in some instances, load dump. Also, the protection circuits formed according to the present invention may take a multitude of designs. For example, a protection circuit may have extremely high voltage and relatively lower voltage spike absorbing portions and connections to the integrated circuit so that only those integrated circuit portions that are likely to experience load dump or EOS connect to the higher voltage absorbing portions. The other integrated circuit components may then connect to the relatively lower voltage spike absorbing portions to protect against ESD.

Yet another technical advantage of the present invention is that it removes from the integrated circuit substrate the heat that the protection circuitry generates while protecting the integrated circuit. This insures proper operation of the integrated circuit during and after an electrical transient.

A further technical advantage of the present invention is that the protection circuitry on the protection circuitry substrate may include a variety of components for uniform power dissipation such as a semiconductor rectifier (SCR) or a gate-coupled MOSFET (GCM), depending on the type of electrical transients against which the protection circuitry protects.

In the case of EOS, the use of large devices with uniform power dissipation can improve reliability and reduce yield loss. The present invention allows the desired sizing of the protection circuit to achieve this.

BRIEF DESCRIPTION OF THE DRAWINGS

The invention and its modes of use and advantages are best understood by reference to the following Detailed Description of Illustrative Embodiments when read in conjunction with the accompanying drawings, wherein:

FIG. 3 conceptually illustrates a possible substrate configuration of the FIG. 2 embodiment;

FIG. 4 provides an electrical schematic of an embodiment of the present invention.

DETAILED DESCRIPTION OF ILLUSTRATIVE EMBODIMENTS

The illustrative embodiments of the present invention are best understood by referring to the FIGUREs wherein like numerals are used like and corresponding parts of the various drawings.

Figure 1:
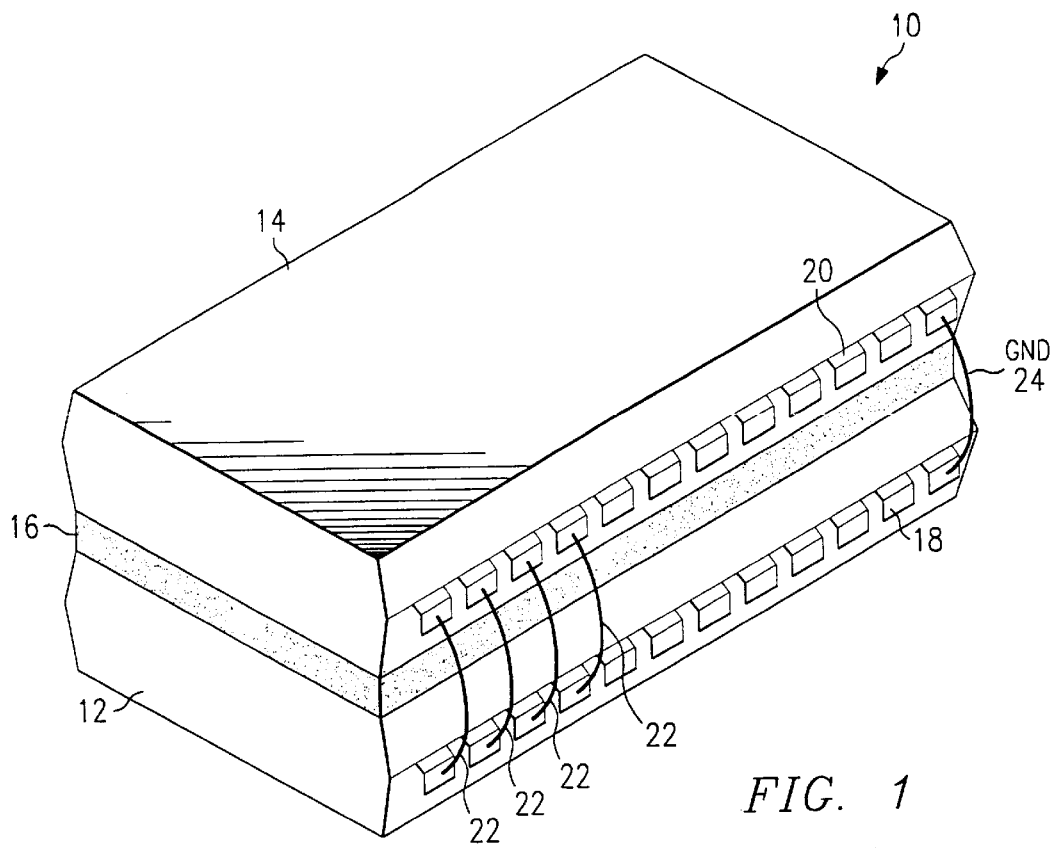
FIG. 1 provides a conceptual view of one embodiment of the present invention.

In FIG. 1 appears integrated circuit chip protection package 10 including unprotected integrated circuit chip 12 that protection chip 14 protects. Separating integrated circuit chip 12 from protection chip 14 is thermal isolation layer 16. Integrated circuit chip 12 and protection chip 14 include numerous pins such as pin 18 and pin 20 on the respective chips. Leads 22 connect the pins of integrated circuit chip 12 to those of protection chip 14. Lead 24 illustrates that at least one pin of integrated circuit chip 12 and at least one pin of integrated chip 14 connects to ground.

Protection chip 14 contains numerous protection devices that connect individually through associated pins 22 to the integrated circuit components to which associated pins 18 connect. Protection chip 14 and integrated circuit chip 12 use separate substrates. This conserves valuable space on integrated circuit chip 12 and keeps heat that protection chip 14 produces from affecting components on integrated circuit chip 12. Thermal isolation layer 16 separates integrated circuit chip 12 and protection chip 14 substrates, in this example. As an alternative to using simply thermal isolation layer 16, this same concept can be implemented by "piggybacking" protection chip 14 on top of integrated circuit chip.

Figure 2:
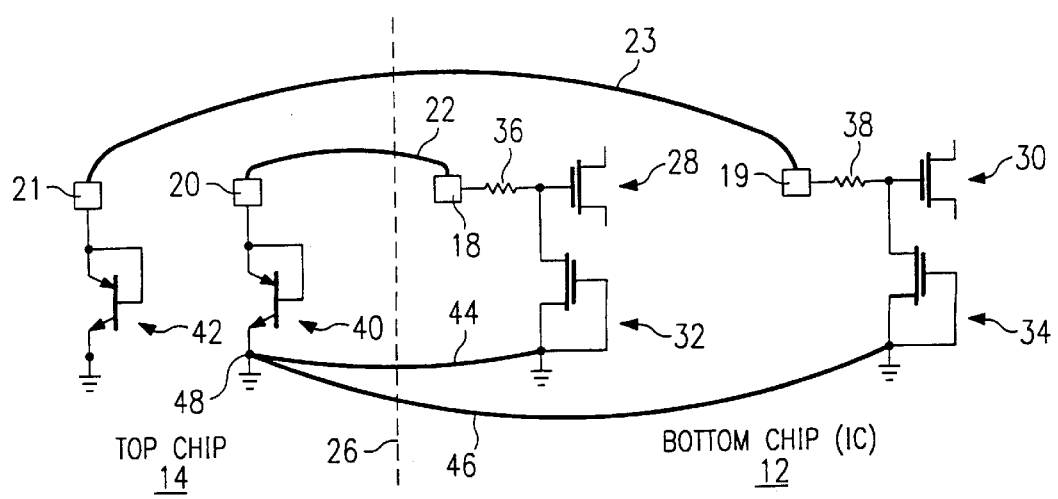
FIG. 2 provides an electrical schematic of one embodiment of the present invention.

FIG. 2 illustrates how integrated circuit chip 12 and protection chip 14 cooperate to provide protection against electrical transients such as those that arising during ESD, EOS, and load dump. Referring to FIG. 2, dash line 26 depicts the separation between the circuitry on integrated circuit chip 12 and the circuitry of protection chip 14. For example, integrated circuit 12 may include a MOSFET device such as MOSFET device 28 and MOSFET device 30. Connecting to MOSFET devices 28 and 30 are grounded gate MOSFETs 32 and 34. These two devices connect to pins 18 and 19, respectively, through resistors 36 and 38. From pins 18 and 19, leads 22 and 23 connect, respectively, to pins 20 and 21. On protection chip 14, semiconductor rectifier (SCR) 40 connects to pin 20, while SCR 42 connects to pin 21. To trigger SCR 40 on protection chip 14, the ground pins are joined together as indicated by leads 44 and 46 that connect in common at ground pin 48.

In FIG. 2, therefore, grounded gate MOSFETs 32 and 34, respectively, protect MOSFETs 28 and 30 on integrated circuit chip 12 at least to some degree at their input gates. Their additional function is to trigger the primary protection devices of SCRs 40 and 42. As FIG. 2 illustrates, grounded gate MOSFET 32 and resistor 36 serve as a protector device combination that triggers SCR 40 and causes SCR 40 to turn on. Once triggered, SCRs 40 and 42 protect MOSFETs 28 and 30 to a much higher protection level by shunting the high-energy pulse to ground. Because the ground bus pins for both integrated circuit chip 12 and protection chip 14 are connected in common, the same voltage that goes to grounded gate MOSFET 32 and resistor 36 goes to protection chip 14. For each of the MOSFETs or other integrated circuit components on integrated circuit chip 12, an associated trigger device such as that formed by grounded gate MOSFET 32 and resistor 36 connects to the protected component. Because the primary protection devices, i.e., SCRs 40 and 42 in this example, reside separately on protection chip 14, the space and temperature restrictions that exist on integrated circuit chip 12 do not impose limits on the protection device sizes.

One alterative embodiment of the present invention may be to combine the circuitry of integrated circuit chip 12 and protection chip 14 on a single chip or substrate. In this alternative embodiment, individual circuits are separated so that separate substrate regions on the single chip associate with the integrated circuit and the protection circuit. The circuits then connect through a lead such as lead 22. Yet another implementation of the present invention, forms protection chip 14 as part of a multi-chip module (MCM) that includes numerous integrated circuit chips such as integrated circuit chip 12. This embodiment has some or all of the MCM integrated circuit chip connect to the protection chip.

Another aspect of the present invention is the flexibility of using different components, instead of or in addition to SCRs, to provide the necessary electrical transient protection. SCRs are attractive because they are highly efficient in triggering and directing electrical transients to ground. Other protection devices may, however, replace the SCR to provide additional or different functions. For example, a MOSFET gate-coupled (GCM) i.e., one having its gate coupled through a resistor to ground to uniformly trigger and dissipate power may be desirable for some EOS applications as illustrated in FIG. 4. These devices are known to result in uniform power dissipation under EOS or ESD. See. e.g., C. Duvvury, C. Diaz, and T. Haddock, "Achieving Uniform NMOS device power distribution, for Sub-micron ESD Reliability", International Electron Device Meeting 1992, and C. Diaz, S. Kang, and C. Duvvury, "Studies of EOS Susceptibility in 0.6 $\mu$m NMOS ESD I/O Protection Structures" EOS/ESD Symposium, September, 1993.

A possible disadvantage of using SCRs is the "latch up" problem. In latch-up the SCR turns-on, but fails to turn off even when the voltage falls well below the trigger voltage. In this situation, normal operation of the protected integrated circuit may not resume once the electrical transient ends. To overcome this problem, a GCM may be more attractive. GCM's generally do not have the associated latch-up problem of SCRs.

Yet another type of device may be used instead of SCRs 40 and 42 to address the load dump problem. Because of the very high-energy level that the protection circuitry must dissipate in the load dump situation, it is not practical to use a GCM or other MOSFET device. The size limitations required for energy dissipation at the levels occurring during loud dump dictate the use of a large-area SCR or similar device that does not require the amount of area of the MOSFET devices. These and other variations exist fully within the concepts and scope of the present invention.

In FIG. 3 appears a layout of the device connections of the embodiment that appears in FIG. 2. Referring to FIG. 3, integrated circuit chip or substrate region 12 includes lead 52 that may go to other circuitry on integrated circuit chip 12 and that connects to N+ region 54. Lead 56 connects between ground, N+ region 58 and N+ region 54. Connecting also to lead 56 is lead 44 that goes to N+ region 60 of protection chip 14. On integrated circuit chip 12, N− region 62 overlaps N+ region 54 to suppress avalanche at the high end of the resistor 36. The combination of P substrate region 64 with N+ region 54 and N+ region 58 form grounded-gate MOSFET 32. MOSFET 28 is connected to terminal 52 and is not shown in FIG. 3.

On protection chip or region 14, connections to resistor 36 that lead 22 makes to N+ region 66 and P+ region 68. N− region 70 surrounds N+ region 66 and P+ region 68. N− region 70 overlaps N+ region 72 and together with N+ region 60 form SCR 40 for the necessary triggering and protection of MOSFET 28 on integrated circuit 12. FIG. 3 also shows ground connection 76 and 78 to P regions 74 and 64 on protection chip 14 and integrated circuit 12, respectively. As an optional connection that the FIG. 3 embodiment does not require, lead 80 may connect P substrate 74 and P substrate 64 in common to ground.

One aspect of the FIG. 3 embodiment is N+ region 72. U.S. Pat. Nos. 5,012,317 and 4,439,616 to Robert N. Rountree and assigned to Texas Instruments Incorporated, the assignee hereof (hereinafter such U.S. Patents are called collectively "Rountree") which are herein incorporated by reference describe use of N+ region 72 to reduce the voltage of the SCR so that it triggers at a lower voltage than what might otherwise be possible. For example, suppose that the designed trigger voltage of SCR 40 is 50 volts. By using N+ region 72 according to the concepts of Rountree it is possible to lower the trigger voltage to 25 volts, for example, so that SCR 40* protects integrated circuit MOSFET 28 at the lower trigger voltage.

OPERATION

Although the above description sufficiently describes how the various elements of the illustrative embodiments cooperate with one another, the following description of the operation of one embodiment is provided for completeness. FIG. 2, which illustrates the present embodiment operates to protect against ESD, EOS, and other types of high-energy pulses including some load dump instances. In the FIG. 2 embodiment, a metal oxide semiconductor device such as MOSFET 32 or 34 breaks down into snapback and the pad voltage built up through resistors 36 and 38, for example, triggers the protection SCR 40 and 42 on protection chip 14. Thus, while gate grounded MOSFETs 32 and 34 together with their respective resistors 36 and 38 dissipate some energy from protected MOSFETs 28 and 30, the main dissipation of energy occurs on protection chip 14. The combination of grounded gate MOSFETs 32 and 36, for example, operates as a trigger device for triggering SCR 40 on protection chip 14. The trigger device that gate grounded MOSFET 32 and resistor 36 form, however, does not provide any hole current into the substrate to trigger SCR, but the SCR triggers only on the conduction through lead 22.

In summary, therefore, the present invention provides a method and system for protecting integrated circuits against electrical transients, including ESD, EOS, and load dump situations and includes a high-energy pulse protection circuit formed on a substrate separate from the substrate of the protected integrated circuit. A primary protection device on the protection circuit substrate has at least one connection with the integrated circuit for receiving and dissipating through the connection a high-energy pulse or electrical transient to protect the integrated circuit from the high-energy pulse. This separate substrate for the protection circuit couples with a triggering circuit on the integrated circuit substrate to provide a high degree of circuit protection that is flexible for different levels of energy transients.

Although the invention has been described with reference to the above specified embodiments, this description is not meant to be construed in a limiting sense. Various modifications of the disclosed embodiment, as well as alternative embodiments of the invention will become apparent to persons skilled in the art upon reference to the above description. It is, therefore, contemplated that the appended claims will cover such modifications that fall within the true scope of the invention.

What is claimed is:

1. A high-energy pulse protection apparatus for protecting an integrated circuit from an externally created high-energy pulse, the protection apparatus comprising:
   an integrated circuit substrate region associated with the integrated circuit, said integrated circuit substrate region comprising a first conductive substrate;
   a protection circuit substrate region being disassociated from said integrated circuit substrate region while being connected in common with said integrated circuit substrate region to electrical ground, said protection circuit substrate region comprising a second conductive substrate;
   a primary protection circuit associated with said protection circuit substrate region and having at least one connection with the integrated circuit for receiving a high-energy pulse and dissipating the high-energy pulse through said at least one connection and through said protection circuit substrate region to said electrical ground for protecting the integrated circuit from the high-energy pulse.

2. The apparatus of claim 1, wherein said integrated circuit substrate region comprises an integrated circuit chip and said protection circuit substrate region comprises a protection circuit chip, said integrated circuit chip and said protection circuit chip being separate and distinct from one another.

3. The apparatus of claim 1, wherein said integrated circuit substrate region and said protection circuit substrate region comprise separate and distinct regions of a single chip.

4. The apparatus of claim 1, wherein said primary protection circuit comprises a semiconductor rectifier for receiving the high-energy pulse and dissipating the high-energy pulse to electrical ground through said protection circuit substrate region.

5. The apparatus of claim 1, wherein said primary protection circuit comprises a semiconductor rectifier, for receiving the high-energy pulse and dissipating the high-energy pulse to said protection circuit substrate region said semiconductor rectifier having an associated trigger circuit.

6. The apparatus of claim 5, wherein said trigger circuit is located on the integrated circuit substrate region and comprises a resistor and a gate-coupled MOSFET connected in series between said at least one connection and electrical ground.

7. The apparatus of claim 1, wherein said primary protection circuit comprises a gate-coupled MOSFET for receiving the high-energy pulse and dissipating the high-energy pulse to electrical ground through said protection circuit substrate region.

8. The apparatus of claim 1, wherein said integrated circuit substrate region comprises an integrated circuit chip and said protection circuit substrate region comprises a protection circuit chip and further comprising a plurality of said integrated circuit chips for connection to said protection circuit chip to form a protected multi-chip module.

9. A method for protecting an integrated circuit from an externally created high-energy pulse, comprising the steps of:
   associating an integrated circuit substrate region with the integrated circuit, said integrated circuit substrate region comprising a first conductive substrate;
   disassociating a protection circuit substrate region from the integrated circuit substrate region while connecting the integrated circuit substrate region in common with the protection circuit substrate region to electrical ground, said protection circuit substrate region comprising a second conductive substrate;
   associating a primary protection circuit with the protection circuit substrate region so that the integrated circuit has at least one connection to the primary protection circuit and dissipating a high-energy pulse through the at least one connection and the protection circuit substrate region to the electrical ground to, thereby, protect the integrated circuit from the high-energy pulse.

10. The method of claim 9, further comprising the step of separating the integrated circuit substrate region and the protection circuit substrate region on separate and distinct chips.

11. The method of claim 9, further comprising the step of separating the integrated circuit substrate region and the protection circuit substrate region on separate and distinct regions of a single chip.

12. The method of claim 9, further comprising the steps of receiving the high-energy pulse in a semiconductor rectifier and dissipating the high-energy pulse to electrical ground through the protection circuit substrate region.

13. The method of claim 9, further comprising the steps of receiving the high-energy pulse in a primary protection circuit that has an associated trigger circuit on the integrated circuit substrate region and dissipating the high-energy pulse to electrical ground through the protection circuit substrate region.

14. The method of claim 9, further comprising the steps of receiving the high-energy pulse in a primary protection circuit comprising a gate-coupled MOSFET and dissipating the high-energy pulse to electrical ground through the protection circuit substrate region.

15. The method of claim 8, further comprising the steps of connecting wherein the integrated circuit substrate region comprises an integrated circuit chip and the protection circuit substrate region comprises a protection circuit chip, and further comprising a plurality of the integrated circuit chips to the protection circuit chip to form a protected multi-chip module.

16. A method of forming a high-energy pulse protection apparatus for protecting an integrated circuit from an externally created high-energy pulse, comprising the steps of:
   forming an integrated circuit substrate region associated with the integrated circuit, said integrated circuit substrate region comprising a first conductive substrate;
   forming a protection circuit substrate region that is disassociated from the integrated circuit substrate region while being connected in common with the integrated circuit substrate region to electrical ground, said protection circuit substrate region comprising a second conductive substrate;
   forming a primary protection circuit associated with the protection circuit substrate region and having at least one connection with the integrated circuit for receiving a high-energy pulse and dissipating through the at least one connection and through the protection circuit substrate region to the electrical ground for protecting the integrated circuit from the high-energy pulse.

17. The method of claim 16, further comprising the steps of forming the integrated circuit substrate region to comprise an integrated circuit chip and forming the protection circuit substrate region to include a protection circuit chip so that the integrated circuit chip and the protection circuit chip are separate and distinct from one another.

18. The method of claim 16, further comprising the steps of forming the integrated circuit substrate region and the protection circuit substrate region to be separate and distinct regions of a single chip.

19. The method of claim 16, further comprising the steps of forming the primary protection circuit to include a semiconductor rectifier for receiving the high-energy pulse and dissipating the high-energy pulse to electrical ground through the protection circuit substrate region.

20. The method of claim 16, further comprising the step of forming the primary protection circuit to include a semiconductor rectifier, for receiving the high-energy pulse and dissipating the high-energy pulse to electrical ground through the protection circuit substrate region said semiconductor rectifier having an associated trigger circuit on the integrated circuit substrate region for reducing the primary protection circuit trigger voltage.

21. The method of claim 16, further comprising the step of forming the primary protection circuit to include a gate-coupled MOSFET for receiving the high-energy pulse and dissipating the high-energy pulse to electrical ground through the protection circuit substrate region.

* * * * *